Figure 1:
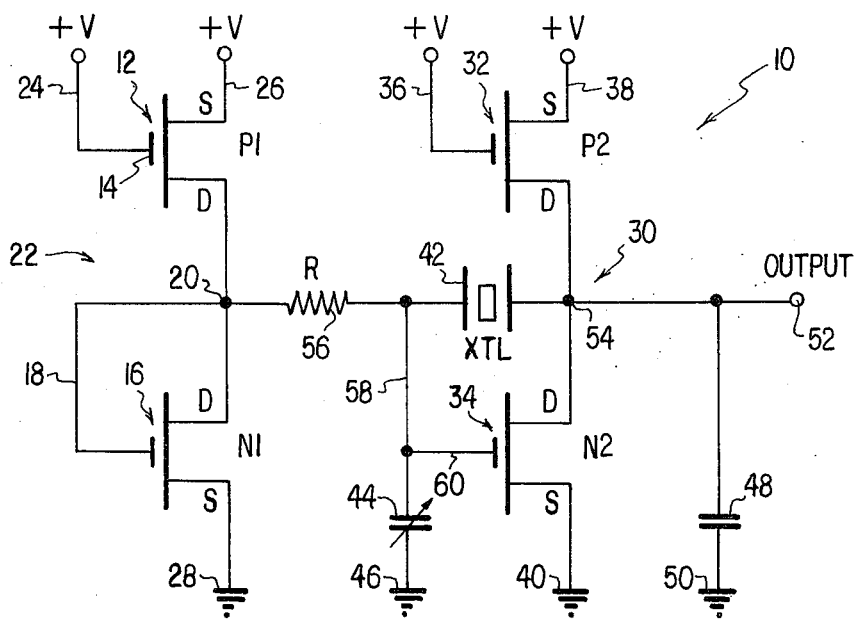

United States Patent [19]
O'Connor

[11] 3,959,744
[45] May 25, 1976

[54] CMOS OSCILLATOR HAVING BIAS CIRCUIT OUTSIDE OSCILLATOR FEEDBACK LOOP

[75] Inventor: Arthur H. O'Connor, Lancaster, Pa.

[73] Assignee: Time Computer, Inc., Lancaster, Pa.

[22] Filed: Feb. 26, 1975

[21] Appl. No.: 553,101

[52] U.S. Cl. .............................. 331/116 R; 58/23 A; 331/108 A; 331/185
[51] Int. Cl.² ........................................... H03B 5/36
[58] Field of Search ....... 331/108 A, 116 R, 116 M, 331/117 R, 185; 58/23 A, 23 AC, 23 R; 307/304, 313

[56] References Cited
UNITED STATES PATENTS 3,823,546  7/1974  Gortz et al. ................. 331/116 R X
3,838,566  10/1974  O'Connor et al. .......... 331/116 R X

*Primary Examiner*—Siegfried H. Grimm
*Attorney, Agent, or Firm*—LeBlanc and Shur

[57] ABSTRACT

Disclosed is a highly stable CMOS oscillator for use as the master time reference in a wristwatch. A novel bias circuit comprising a CMOS pair and a relatively large resistor supply a bias voltage to the amplifier of the oscillator. The resistor can be made larger than normal because it is outside the oscillator feedback loop and does not reduce the amplifier open loop gain.

11 Claims, 2 Drawing Figures

U.S. Patent May 25, 1976 3,959,744

CMOS OSCILLATOR HAVING BIAS CIRCUIT OUTSIDE OSCILLATOR FEEDBACK LOOP

This invention relates to an improved low power and highly stable oscillator circuit and, more particularly, to a CMOS oscillator circuit adapted for use as the time base in a quartz wristwatch. Th oscillator has a novel bias circuit which improves amplifier gain and stability, enhances oscillator starting, and provides improved control over the oscillator feedback capacitance.

In recent years, considerable effort has been directed toward the development of a wristwatch with increased accuracy over and above that available from a conventional electromechanical oscillator such as the conventional wristwatch balance wheel. More accurate master time references have been obtained through the use of a quartz crystal oscillator which provides a relatively high frequency time base. Electrical signals from the high frequency source are divided down through a multistage divider to provide low frequency signals used to display time and, in some instances, also calendar information. Most successful wristwatches of this type have employed complementary symmetry MOS transistors which evidence extremely low power consumption and which are susceptible to fabrication using large scale integration techniques. CMOS oscillators suitable for forming the master reference frequency source in a wristwatch are shown in assignee's U.S. Pat. Nos. 3,560,998; 3,568,091; 3,664,118; 3,721,084; and others.

In conventional wristwatch oscillator constructions, a bias resistor is connected from the common drain to the common gate of a pair of complementary MOS field effect transistors. This resistor establishes a DC quiescent operating point determined by the threshold of the transistor devices forming the complementary pair. It has been found necessary to include this resistor in the feedback circuit in order to bias the complementary transistor pair to an active operating region so that the oscillator will start oscillating. However, the presence of this resistor in the feedback circuit means that it cannot have a value very much greater than about 20 megaohms to insure reliable starting of the circuit and even at these relatively low values, the presence of the resistor in the feedback circuit reduces the open loop amplifier gain to very close to one.

The present invention is directed to an improved CMOS oscillator for so-called quartz wristwatches and in particular is directed to an oscillator in which the bias resistor is outside of the oscillator feedback circuit. In the present invention, the DC bias point is established by a separate CMOS pair. The bias is transmitted by a relatively large resistor to the oscillator proper but since it is outside the oscillator feedback loop, it does not provide any AC feedback, so as to reduce the gain of the oscillator amplifier. In the present invention, the bias resistor may have a resistance value on the order of from 50 to 100 megaohms but since it is outside the feedback loop, the oscillator amplifier may operate with its maximum open loop gain. This substantially enhances the starting characteristic of the oscillator and significantly increases the stability of the oscillator in response to variations in supply voltage. It also provides improved control over the feedback capacitance.

It is therefore one object of the present invention to provide an improved CMOS oscillator.

Another object of the present invention is to provide an improved oscillator for use as the basic time reference in a wristwatch.

Another object of the present invention is to provide a wristwatch oscillator having improved stability and improved starting characteristics.

Another object of the present invention is to provide a CMOS oscillator having an improved bias circuit.

Another object of the present invention is to provide a low power CMOS oscillator in which the bias for the oscillator is derived from a separate CMOS pair through a relatively large resistor all connected outside of the feedback loop of the oscillator.

Figure 2:
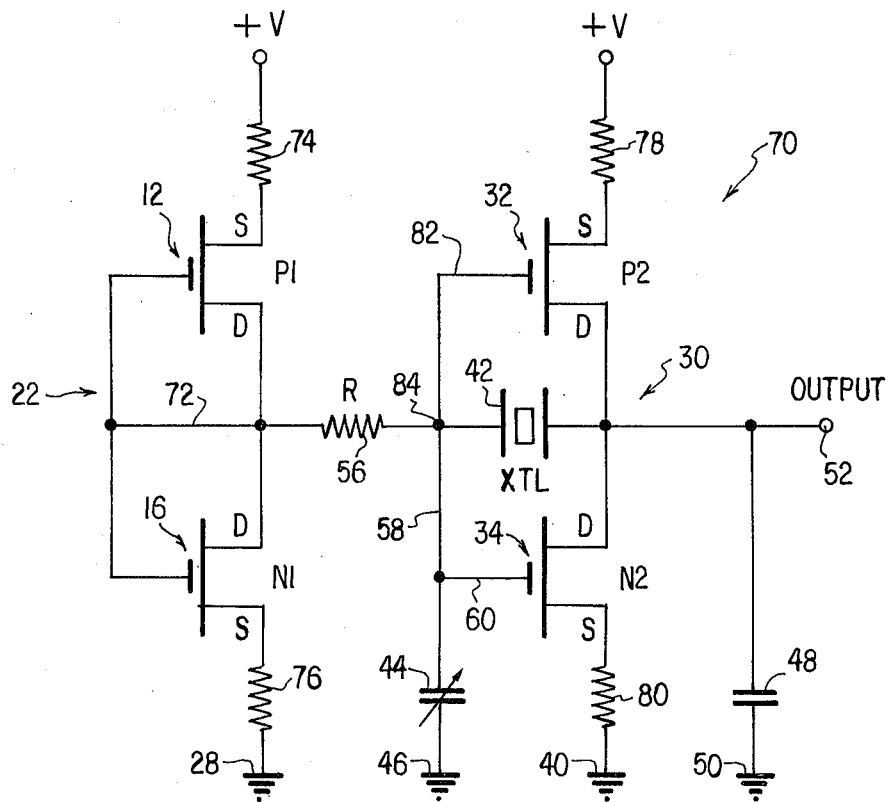

These and further objects and advantages of the invention will be more apparent upon reference to the following specification, claims and appended drawings wherein:

FIG. 1 is a circuit diagram of a first embodiment of an oscillator constructed in accordance with the present invention; and FIG. 2 is a circuit diagram of a modified embodiment of the oscillator of this invention.

Referring to the drawings, the CMOS oscillator of the present invention generally indicated at 10 in FIG. 1 comprises a first CMOS pair formed of P-channel enhancement mode transistor 12 labeled P1, having a gate terminal 14, a source terminal labeled S, and a drain terminal labeled D, and an N-channel enhancement mode transistor 16, similarly having gate, source and drain electrodes. The gate of N-channel transistor 16 is connected by a lead 18 to the common drain junction 20 of the transistor pair 22, whereas the gate 14 of transistor 12 is connected to the positive side of the power supply by a lead 24. By way of example only, the power supply may be a conventional 3-volt wristwatch battery formed by a pair of 1½ volt battery cells connected in series. The source of P-channel transistor 12 is also connected to the positive side of the power supply by a lead 26 and the source of N-channel transistor 16 is connected to the negative side of the power supply indicated by ground at 28.

Also forming part of the oscillator 10 in FIG. 1 is a second CMOS pair 30, comprising P-channel enhancement mode MOS transistor 32 and N-channel enhancement mode MOS transistor 34. The gate and source electrodes of transistor 32 are again connected to the positive side of the power supply by respective leads 36 and 38. The source of N-channel transistor 34 is connected to the negative side of the power supply as indicated by ground at 40.

Connected in the feedback path between the drain and gate of N-channel transistor 34 is a piezo-electric quartz crystal 42. A variable capacitor 44 which constitutes the tuning capacitor for the oscillator is connected between the gate of transistor 44 and the negative side of the power supply as indicated by ground 46. A second fixed capacitor 48 is connected between ground 50 and the oscillator output terminal 52, the output being derived from the common drain junction 54. A bias voltage is applied from the common drain junction 20 of the first transistor pair 22 by way of a relatively large bias resistor 56 and leads 58 and 60 to the gate of N-channel transistor 34 of the second transistor pair 30. The circuit in FIG. 1 is designed to operate at 32,768 Hz and produces a squarewave output having extreme frequency stability, particularly with respect to small variations in the supply voltage from the battery. Fine tuning of the oscillator output frequency is obtained through manual variation of the adjustment of variable capacitor 44.

FIG. 2 shows a modified embodiment of the oscillator of the present invention in which like parts bear like reference numerals. The oscillator 70 in FIG. 2 again comprises a first CMOS transistor pair 22 and a second CMOS transistor pair 30, the former comprising P-channel transistor 12 and N-channel transistor 16, and the latter comprising P-channel transistor 32 and N-channel transistor 34. In FIG. 2, the first transistor pair 22 is connected in the more conventional CMOS configuration, that is, gate to gate and drain to drain. However, for the first pair 12 and 16, the gates and drains are connected together by a lead 72. In this embodiment, the source electrodes of the first pair are shown as connected to the opposite sides of the power supply through respective current limiting resistors 74 and 76. In some instances, it is possible to eliminate resistors 74 and 76 depending upon the geometries of the transistors used in the circuit. Similar current limiting resistors 78 and 80 connect the sources of the second pair of transistors 32 and 34 to the opposite sides of the power supply and these too may be eliminated where the transistor geometry permits.

The transistor pair 30 in FIG. 2 is also connected differently from the embodiment in FIG. 1. In FIG. 2, the gates of the two transistors 32 and 34 are connected together by a lead 82 at the common junction 84 inbetween quartz crystal 42 and bias resistor 56. The embodiment of FIG. 2 is, in other respects, identical to the embodiment of FIG. 1 previously described and again the circuit produces a stable squarewave output at output terminal 52, preferably having a frequency of 32,768 Hz.

It is apparent from the above that the present invention provides an improved CMOS oscillator construction particularly adapted for fabrication as a part of a large scale integrated circuit usable as a basic time reference or timing source in a quartz crystal wristwatch. An important feature of the present invention includes the fact that the bias resistor 56 is outside the feedback loop around the amplifier portion of the oscillator to substantially increase open loop gain of the amplifier and the bias resistor can be made much larger; that is, on the order of 50 to 100 megaohms as compared to a maximum of approximately 20 megaohms in previous constructions. The bias for the oscillator is derived through this resistor from a second CMOS transistor pair. The significantly increased amplifier gain enhances oscillator starting and oscillator stability as a function of supply voltage, and gives improved control over the feedback capacitance, that is, reduces the affect of load capacitance on the oscillator.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A low power oscillator comprising a complementary pair of MOS transistors, means coupled to at least one of said transistors forming an oscillatory feedback path for said one transistor, a source of bias potential for said one transistor, and a bias resistor external of said feedback path coupling said source to said transistor, said source of bias potential comprising a second complementary pair of MOS transistors.

2. An oscillator according to claim 1 wherein said second complementary pair have their drain electrodes connected in common, said bias resistor being connected between said common drains and the gate electrode of said one MOS transistor.

3. A low power oscillator for use in a wristwatch comprising first and second pairs of complementary MOS transistors, a quartz crystal coupled between the gate and drain of at lease one transistor of said first pair, a tuning capacitor coupled to said quartz crystal for fine tuning the output frequency of said oscillator, the drains of said second pair of transistors being connected in common, and a bias resistor having a resistance of at least about 50 megohms coupled between the common drain electrodes of said second pair of transistors and the gate electrode of said one transistor of said first pair.

4. An oscillator according to claim 3 wherein each of said pair of transistors comprises a P-channel MOS and an N-channel MOS, said P-channel MOS having its source coupled to a positive power supply terminal and said N-channel MOS having its source coupled to a negative power supply terminal.

5. An oscillator according to claim 4 wherein the gates of said P-channel MOSs are also coupled to a positive power supply terminal.

6. An oscillator according to claim 5 wherein the gate of the N-channel transistor of said second pair is coupled to the common drain connection of said second pair.

7. An oscillator according to claim 4 wherein the gates of each said pair of transistors are connected together.

8. An oscillator according to claim 7 wherein the common gate electrodes of said second pair of transistors are coupled to the common drain electrodes of said second pair.

9. An oscillator according to claim 8 including current limiting resistors coupling the source electrodes of said transistors to their respective power supply terminals.

10. An oscillator according to claim 4 including an output terminal coupled to the common drain electrodes of said first pair of transistors.

11. An oscillator according to claim 10 including a fixed capacitor coupled between said output terminal and a negative power supply terminal.

* * * * *